(12) United States Patent
Ishizaki et al.

(10) Patent No.: US 8,098,006 B2
(45) Date of Patent: Jan. 17, 2012

(54) COLOR EL DISPLAY AND METHOD FOR PRODUCING THE SAME

(75) Inventors: Mamoru Ishizaki, Tokyo (JP); Norimasa Sekine, Tokyo (JP); Manabu Ito, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 377 days.

(21) Appl. No.: 11/999,141

(22) Filed: Dec. 3, 2007

(65) Prior Publication Data
US 2008/0129195 A1  Jun. 5, 2008

(30) Foreign Application Priority Data
Dec. 4, 2006  (JP) ................... 2006-326742

(51) Int. Cl.
*H01J 63/04* (2006.01)
(52) U.S. Cl. ........................................ 313/504
(58) Field of Classification Search .................. None
See application file for complete search history.

(56) References Cited

U.S. PATENT DOCUMENTS

| | | | | |
|---|---|---|---|---|
| 6,150,668 A * | 11/2000 | Bao et al. | | 257/40 |
| 6,870,584 B2 * | 3/2005 | Kawase et al. | | 349/106 |
| 2001/0029055 A1 * | 10/2001 | Ninomiya | | 438/30 |
| 2003/0111663 A1 * | 6/2003 | Yagi | | 257/59 |
| 2006/0181205 A1 * | 8/2006 | Pi et al. | | 313/506 |
| 2007/0236134 A1 * | 10/2007 | Ho et al. | | 313/500 |
| 2009/0091241 A1 * | 4/2009 | Tsou et al. | | 313/504 |

FOREIGN PATENT DOCUMENTS

| | | |
|---|---|---|
| JP | 2001-249627 | 9/2001 |
| JP | 2002-184575 | 6/2002 |
| JP | 2004-207065 | 7/2004 |
| JP | 2004-303609 | 10/2004 |

OTHER PUBLICATIONS

Machine Translation of JP 2001-249627, JP 2002-184575, JP 2004-207065, and 2004-303609.*

* cited by examiner

*Primary Examiner* — Anne Hines
*Assistant Examiner* — Jacob Stern
(74) *Attorney, Agent, or Firm* — Squire, Sanders & Dempsey (US) LLP

(57) ABSTRACT

One embodiment of the present invention is a color EL display characterized in that at least color filters, a thin film transistor circuit, an organic EL layer, and a common electrode are laminated in this order on a transparent substrate. Another embodiment of the invention is a method for producing a color EL display comprising the steps of forming color filters on a transparent substrate; forming a thin film transistor circuit; forming an organic EL layer; and forming a common electrode, wherein a process temperatures of the steps of forming the thin film transistor circuit and subsequent steps are 200° C. or less.

3 Claims, 17 Drawing Sheets

COLOR EL DISPLAY AND METHOD FOR PRODUCING THE SAME

CROSS REFERENCE

This application claims priority to Japanese application number 2006-326742, filed on Dec. 4, 2006, which is incorporated by reference.

BACKGROUND OF THE INVENTION

1. Field of the Invention

The present invention relates to an organic EL display, which is one kind of flat-panel displays.

2. Description of the Related Art

As flat-panel displays, liquid crystal displays and plasma displays are commercialized. However, liquid crystal displays have such problems as a narrow viewing angle and insufficient response to high-speed pixel signals, and plasma displays have such problems as a large amount of power consumption and many technical subjects to be solved for increasing to a larger size than current one.

What is drawing attention recently in contrast to these is an organic electroluminescence display (organic EL display) that uses organic light-emitting materials. By using organic compounds as light-emitting materials, it is expected as a display that can realize a flat-panel display that is self light-emitting, high in response speed, and further free from viewing angle dependency with low power consumption.

Organic EL displays include a simple matrix type one that does not use a thin film transistor (TFT), and an active matrix type one that uses TFT. The simple matrix type display is composed of parallel plural electrodes, an organic EL layer, and plural electrodes perpendicular to the parallel plural electrodes, which are formed on a glass substrate. In a simple matrix type display, the organic EL layer is required to perform very high-brightness emission in a selected moment, thus there are such problems that the organic EL layer degrades severely and wiring resistance results in large voltage drop. On the other hand, in an active matrix type display, on a glass substrate, a TFT circuit is formed, on which an organic EL layer exists, and further a counter electrode is formed. Usually, for a semiconductor of the TFT circuit, amorphous silicon or polysilicon is used. In this case, generally, the counter electrode is used as a cathode to take out light from the substrate side.

However, in active matrix type organic EL displays based on selective coating of R, G and B light-emitting layers, there is such a problem that color purity is insufficient, that is, green is whitish and red is yellowish. In addition, there is such a problem that a "white EL+color filter" system and a "blue EL+color conversion layer" system can be applied only to simple matrix type displays. For the purpose of solving these problems, there is such a method that color filters are formed on TFT on a substrate, on which an organic EL layer is formed (JP-A-2001-249627, JP-A-2002-184575, JP-A-2004-207065, JP-A-2004-303609). However, in the method, it is necessary to connect the TFT and the organic EL by means of a via hole, to result in a complex construction and low reliability.

In addition, since the amount of light that can be taken out from the substrate side is limited to that from a portion given by subtracting the area of nontransparent TFT, an aperture ratio (=light-emitting area/pixel area) is small, and then light with high brightness must be emitted (although not so small for simple matrix types).

SUMMARY OF THE INVENTION

A purpose of the present invention is to create active matrix type organic EL displays with a simple structure having color filters, and to provide organic EL displays of high quality having good color purity. In addition, another purpose thereof is to improve the aperture ratio of active matrix type organic EL displays, thereby reducing load imposed on the organic EL layer. One aspect of the invention is a color EL display characterized in that at least color filters, a thin film transistor circuit, an organic EL layer, and a common electrode are built in this order on a transparent substrate.

DESCRIPTION OF THE REFERENCE NUMERALS AND SIGNS

1: transparent substrate, 2: color filters, 2R: red transmissive color filter, 2G: green transmissive color filter, 2B: blue transmissive color filter, 2W: white transmissive color filter, 2RR: red conversion type color filter, 2GG: green conversion type color filter, 2OC: over coating, 3: TFT circuit, 31: first electrode layer, 32: first insulating layer, 33: first semiconductor layer, 34: second electrode layer, 35: second insulating layer, 36: second semiconductor layer, 37: third electrode layer, 38: third insulating layer, 39: fourth electrode layer, G1 to G3: gate electrode, S1 to S3: source electrode, D1 to D3: drain electrode, C: capacitor electrode, 4: organic EL layer, 41: hole transport layer, 42: light-emitting layer, 42R: red light-emitting layer, 42G: green light-emitting layer, 42B: blue light-emitting layer, 42W: white light-emitting layer, 5: common electrode, 6: seal, 101: ink-replenishing apparatus, 102: doctor apparatus, 103: inking apparatus, 104: flexoplate, 105: cylinder, 106: body to be transferred, 107: stage, 108: ink, 108a: ink pattern

DESCRIPTION OF THE PREFERRED EMBODIMENTS

Figure 1:
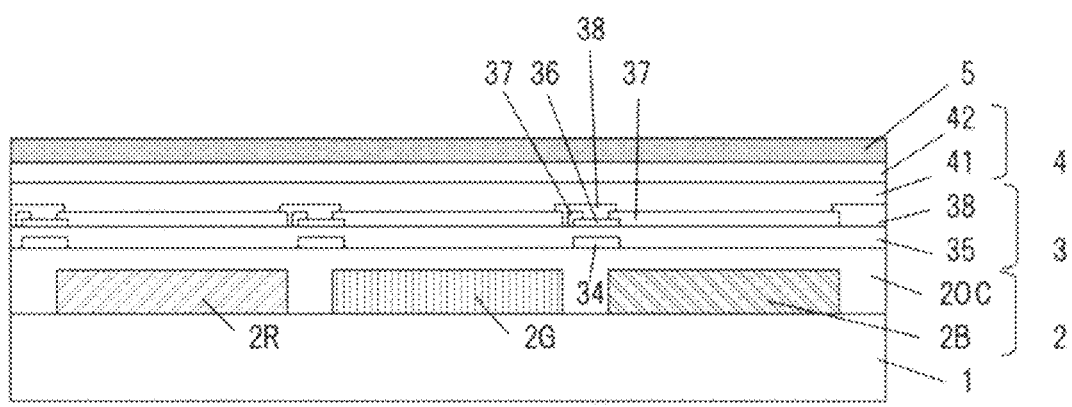
FIG. 1 is a cross-sectional view showing the outline structure of the color EL display of the present invention.

Hereinafter, embodiments of the present invention are described on the basis of attached drawings. In the invention, color filters 2, a TFT circuit 3, an organic EL layer 4, and a common electrode 5 are built in this order on a transparent substrate 1, as shown in FIG. 1. In FIG. 1, the TFT circuit 3 is plainly drawn for the purpose of simplicity, and only one driving TFT is shown.

As the transparent substrate 1, glass may be employed, and, as described later, plastic may also be employed. For example, polyethylene terephthalate (PET), polyethylene naphthalate (PEN), polyethersulfone (PES), polyimide (PI) and the like may be employed. When the transparent substrate 1 is made of plastic, a barrier film formed of $SiO_2$, SiON, $Al_2O_3$, $Y_2O_3$ or the like is desirably provided thereon to prevent the permeation of moisture and oxygen.

Figure 2:
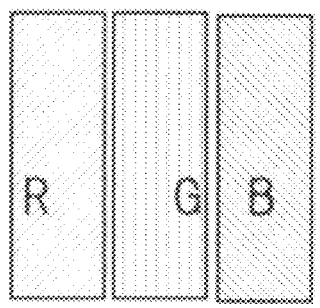
FIG. 2 is arrangement examples of color filters of the invention.
Figure 2:
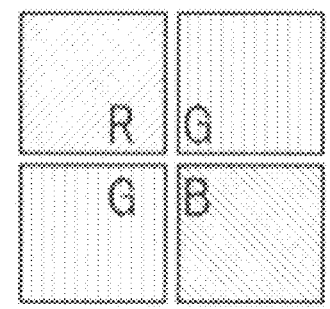
Figure 2:
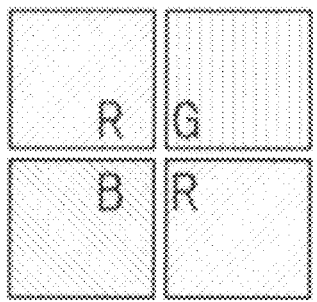
Figure 2:
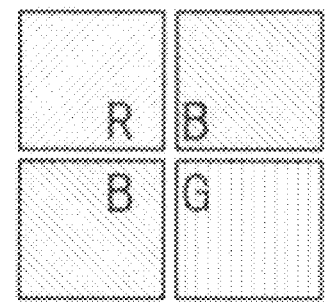
Figure 2:
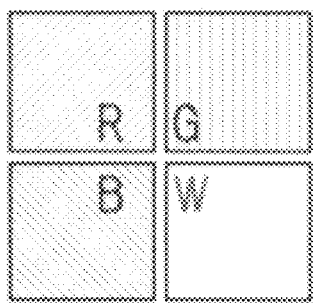

The color filters 2 include at least R, G and B. In addition to R, G and B, as shown in FIG. 2, for example, R, G, G and B, or R, G, B and W may also be employed. Here, R means red, G means green, B means blue, and W means white. The RGB color filters 2 may be a usual transmitting band-restricting type, or a color conversion type which converts received blue light to red or green light. Color filters of a transmitting band-restricting type are formed of photo resists in which pigments of respective colors are dispersed, and color filters of a color conversion type are photo resists in which respective fluorescent coloring materials are mixed. These can be formed by exposure, development and burning, as is the case for a usual negative type photo resist.

Figure 3:
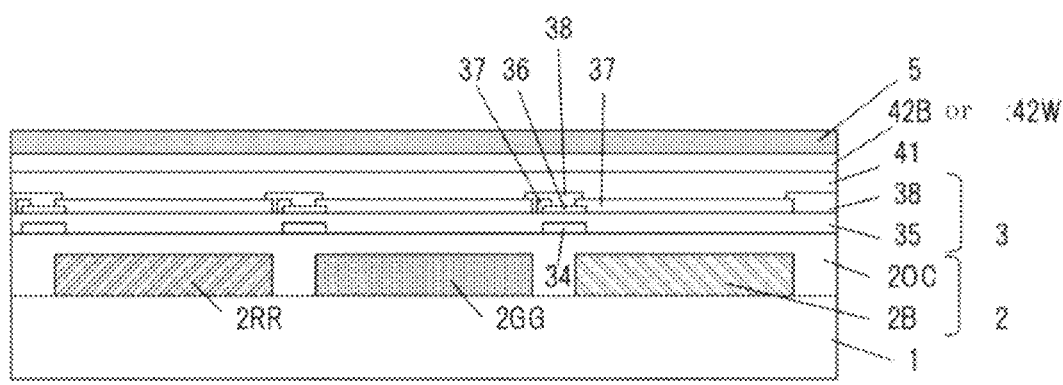
FIG. 3 is a cross-sectional view showing an example of the relation between color filters and organic EL layer of the invention.
Figure 4:
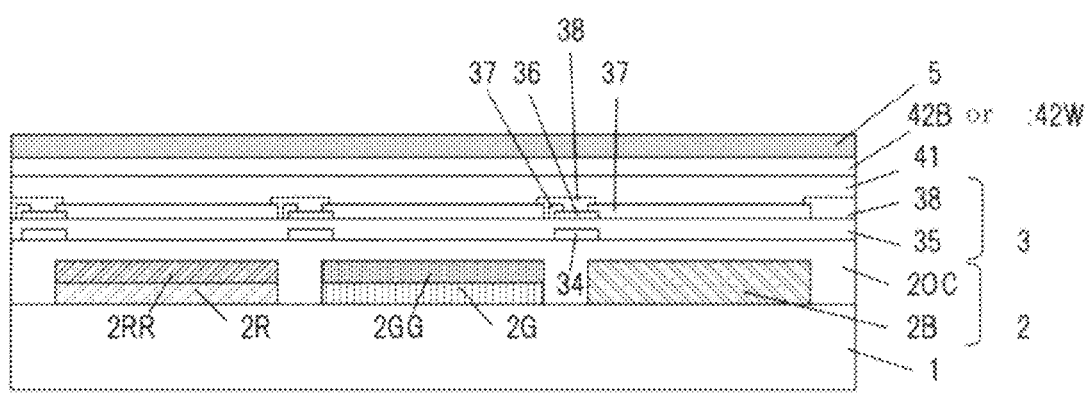
FIG. 4 is a cross-sectional view showing another example of the relation between color filters and organic EL layer of the invention.
Figure 5:
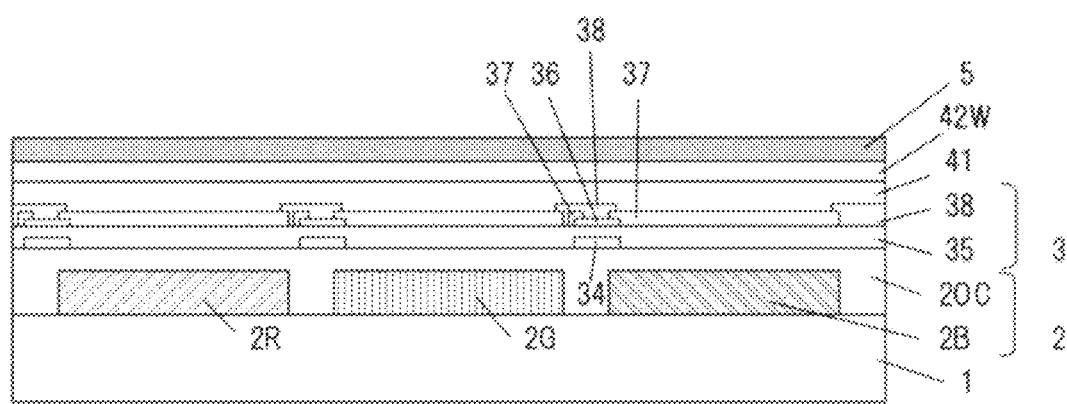
FIG. 5 is a cross-sectional view showing another example of the relation between color filters and organic EL layer of the invention.
Figure 6:
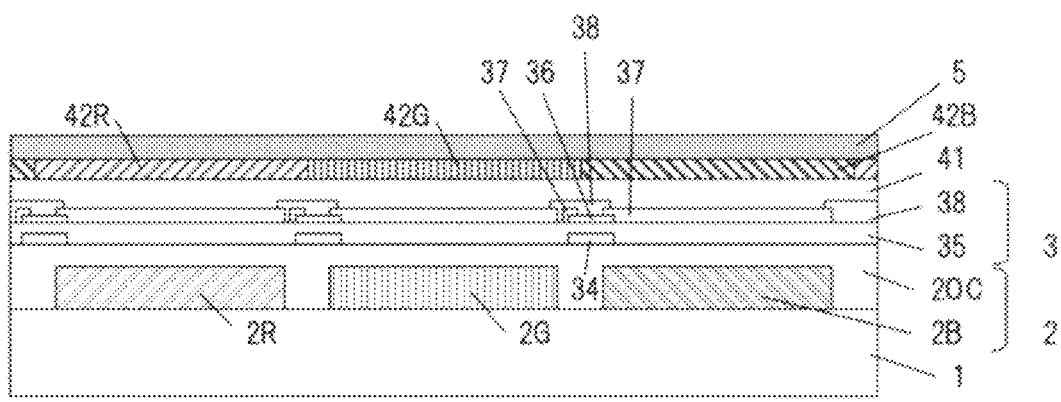
FIG. 6 is a cross-sectional view showing another example of the relation between color filters and organic EL layer of the invention.

When the organic EL layer 4 is blue, it is sufficient in the color filters 2, that R and G are of a color conversion type, and B is of a transmitting band-restricting type (FIG. 3). In this case, a two-layer structure, in which a transmitting band-restricting type is further provided under R and G layers (substrate side), may also be adopted (FIG. 4). When the organic EL layer 4 is white, the color filters 2 may be the same as the case where the organic EL layer 4 is blue (FIGS. 3 and 4), or all the R, G and B may be of a transmitting band-restricting type (FIG. 5). When the organic EL layer 4 is formed of R, G and B selective coating, since the use of the color filters 2 of a transmitting band-restricting type (FIG. 6) results in an effect of improving color purity, it may also be referred to as a color purity-improving type. Further, it is also possible to replace a color filter alone, which corresponds to color having good color purity of emitting light, with W. The color filters 2 may have an over coating layer 2OC that covers the whole to be planarized.

Figure 7:
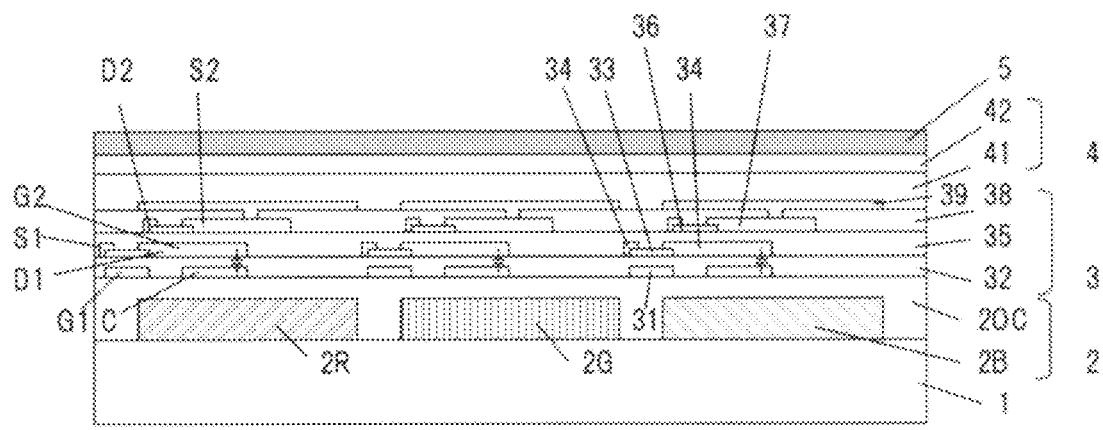
FIG. 7 is a schematic view showing an example of a TFT circuit of the invention.
Figure 7:
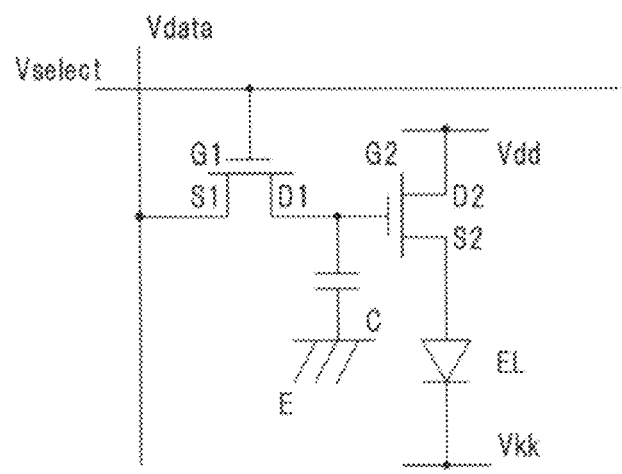
Figure 8:
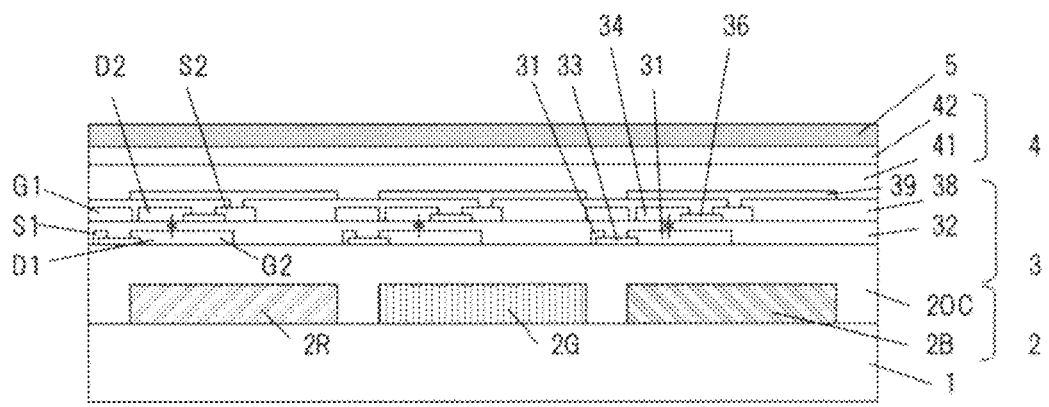
FIG. 8 is a schematic view showing another example of a TFT circuit of the invention.
Figure 8:
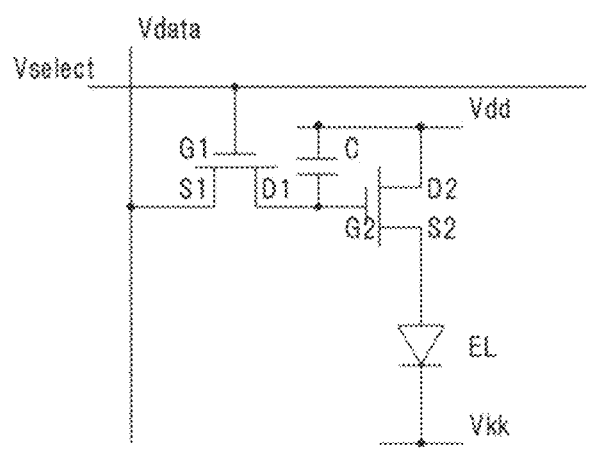
Figure 9:
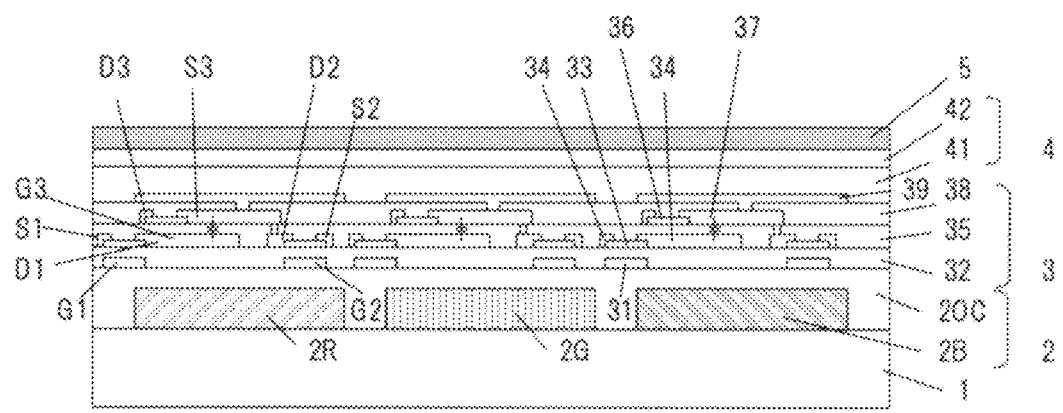
FIG. 9 is a schematic view showing another example of a TFT circuit of the invention.
Figure 9:
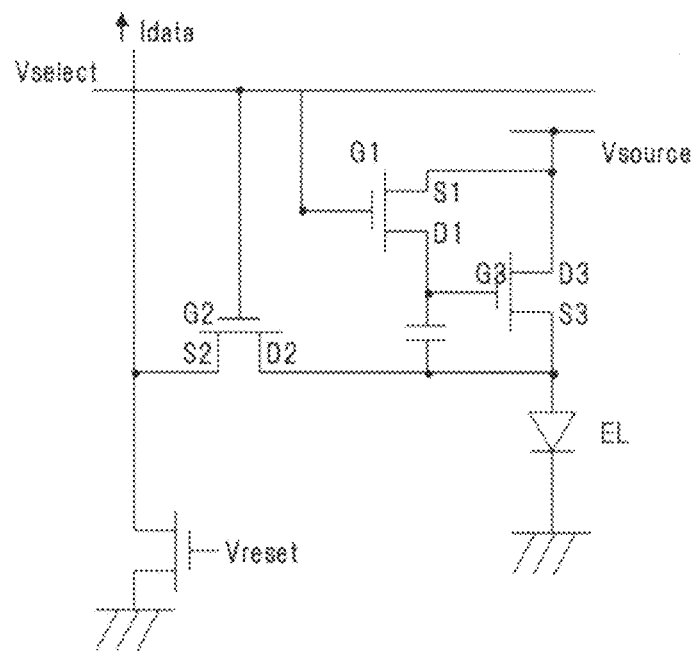
Figure 10:
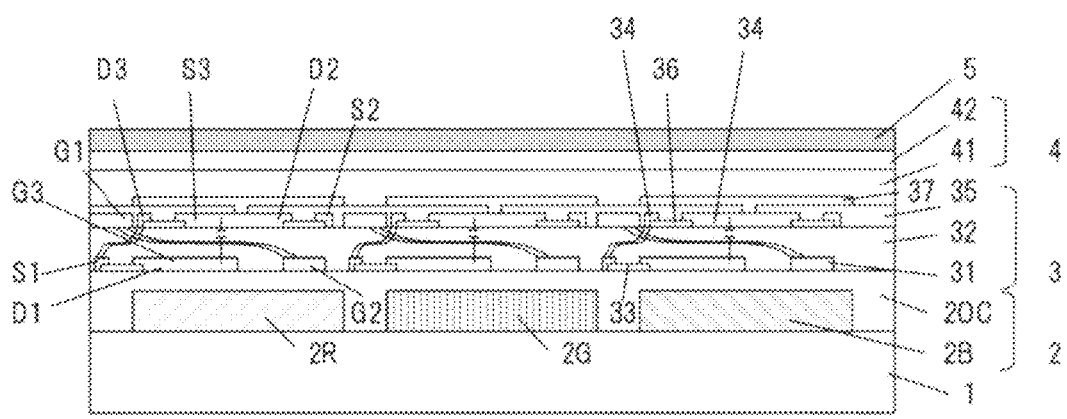
FIG. 10 is a schematic view showing another example of a TFT circuit of the invention.
Figure 10:
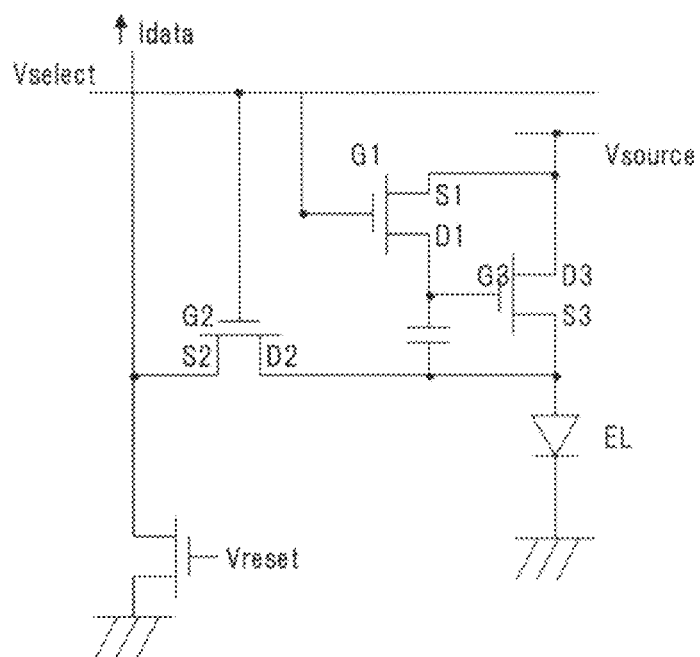

The TFT circuit 3 has at least two TFTs and one or more capacitors, for example, as shown in FIGS. 7 to 10. FIGS. 7 and 8 are examples of voltage driving, and FIGS. 9 and 10 are examples of current driving. Or, publicly known TFT circuit structures other than those shown here may be employed. A capacitor mark shown in the cross-sectional views of FIGS. 7 to 10 means that electrodes overlap with each other while holding an insulating layer therebetween, to form a capacitor. Regarding a portion where top and bottom electrodes are connected in the insulating layer in the cross-sectional view of FIGS. 9 to 10, they are connected through each opening of the insulating layer. Incidentally, FIGS. 7 to 10 show schematically the structure of a TFT circuit, wherein a three dimensionally distributed structure is shown two dimensionally, therefore it is not meant that an element that is cut along a horizontal plane gives exactly the same cross-section. For example, in FIG. 10, top and bottom electrodes are so drawn that they are connected obliquely, but in an actual element they are formed so as to overlap with each other above and below.

In the invention, as a semiconductor layer of TFT, an oxide semiconductor is used. Since an oxide semiconductor is transparent, the use of a transparent material for the electrode and insulating layer enables a substantially transparent TFT to be formed, to prevent degradation of an aperture ratio (here, the phrase "substantially transparent" means that the transmittance is 70% or greater in the wavelength range from 400 nm to 700 nm, which constitute visible light). Further, for forming a conventional amorphous silicon film or polysilicon film, a higher temperature process than 200° C. is necessary. In contrast, many oxide semiconductors operate well even when they are formed into a film at a low temperature such as from room temperature to 200° C., and all the other subsequent processes (photolithography, formation of the organic EL layer 4 and common electrode 5) can be performed at 200° C. or less, thus there is no danger of damaging the color filters 2 (which are usually formed at a temperature of slightly higher than 200° C.). Furthermore, when the formation of the color filters 2 is performed at 200° C. or less, it becomes possible to use a plastic film as the substrate 1, and also possible to produce flexible EL displays.

In addition, conventionally the semiconductor layer of all TFTs of the TFT circuit 3 was formed in a single plane. This is due to high cost for forming amorphous silicon and polysilicon. However, by using an oxide semiconductor, an inexpensive sputtering method can be employed and two layers or more of oxide semiconductors can be utilized. On this occasion, it is possible to use oxide semiconductors having different conditions for respective layers, to result in a larger degree of freedom in circuit design. For example, in FIGS. 7 to 9, each semiconductor of a scanning TFT and driving TFT is formed in different layers, and thus it is possible to use properly TFTs, such as a TFT having a small OFF current for the scanning TFT and a TFT having a large ON current for the driving TFT. Or, it is also possible to select an n type for one, and a p type for the other. Further, depending on circuits, the formation of an opening in the first insulating layer (for example, FIGS. 7 to 9) or in the second insulating layer (for example, FIG. 7) becomes unnecessary, to make it possible to enhance reliability and simplify processes.

For the oxide semiconductor, an oxide including at least anyone kind of In, Ga, Zn, Sn and Mg can be employed. Specifically, there can be mentioned indium oxide, zinc oxide, tin oxide, ZnMg oxide, InGaZn oxide, $In_xZn_{1-x}$ oxide, $In_xSn_{1-x}$ oxide, $In_x(Zn,Sn)_{1-x}$ oxide, GaSn oxide, InGaSn oxide, InGaZnMg oxide and the like. These can be formed into a film by sputtering, laser ablation, vacuum evaporation and the like. In particular, it is possible to obtain easily with sufficient reproducibility InGaZn oxide having a mobility of 5 cm²/Vs or greater even when it is subjected to sputtering film formation at any temperature from room temperature to 200° C., and is a suitable raw material. Further, InGaZnMg oxide has such characteristics as having a mobility equivalent to that of InGaZn oxide, and further being resistant to ultraviolet rays (hardly malfunctions) since it has a large band gap. Here, InGaZn oxide has a composition ratio close to In:Ga:Zn:O=1:1:1:4. However, actually there exist some amount of oxygen vacancies, and properties of the oxide do not change even when some amount of deviation of metal composition exists. Therefore, allowable composition ratios are In:Ga:Zn:O=(0.7 to 1.3):(0.7 to 1.3):(0.7 to 1.3):(3 to 4). Basically it is in an amorphous state, but may partially contain a microcrystalline structure. InGaZnMg oxide is formed by substituting a part (50% or less) of Zn in InGaZn oxide with Mg. For sputtering, RF or DC reactive sputtering is suitable.

In addition, high molecular weight organic semiconductor materials such as polythiophene, polyallylamine, fluorene-bithiophene copolymer, and derivatives thereof, and low molecular weight organic semiconductor materials such as pentacene, tetracene, cupper phthalocyanine, perylene, and derivatives thereof can be employed. In view of lowering cost, imparting flexibility and enlarging area, the use of organic semiconductors, to which a printing method can be applied, is desirable. Further, carbon compounds such as carbon nanotube and fullerene, and a semiconductor nano-particle dispersion liquid can also be employed as a semiconductor material. As a printing method of an organic semiconductor, publicly known methods such as gravure printing, offset printing, screen printing and ink jet method can be employed. The above-described organic semiconductor has, generally, low solubility in a solvent, therefore the use of flexographic printing, reverse offset printing, ink jet method, or dispenser, which are suitable for printing a low viscosity solution, is desirable.

For the electrode, indium tin oxide (ITO), indium zinc oxide (IZO) and the like are suitably used. For the insulating layer, $SiO_2$, SiON, $Al_2O_3$, $Y_2O_3$ and the like are suitably used. These can also be formed into a film at a temperature from room temperature to 200° C. by sputtering, laser ablation, vacuum evaporation and the like. In particular, reactive sputtering is suitable. Post-annealing may also be performed. Temperature for post-annealing may also be 200° C. or less. Or, the use of a transparent organic insulating layer is also possible. For example, fluorine-containing resin, polyvinyl alcohol, epoxy resin, acrylic resin and the like can be used. The use of a photosensitive resin makes patterning easy. Furthermore, insulating layers of a heterogeneous type may be overlapped.

When a transparent material is used for all of the electrode, semiconductor and insulating layer, as described above, the resulting whole TFT circuit becomes transparent, thereby making it possible to enhance the aperture ratio. Incidentally, for the patterning of an electrode, semiconductor and insulating layer, photolithography+etching are used, wherein the photolithographic process is usually performed at 120° C. or less, and etching is also performed at several tens degree centigrade or less.

Next, on a pixel electrode (a portion where either a source electrode or drain electrode of a driving TFT is formed in a large area, or an electrode having a large area connected to either a source electrode or drain electrode, which is to be contacted with the organic EL layer 4), the organic EL layer 4 is formed. As the organic EL layer 4, usually, a multilayer structure of a hole transport layer 41, light-emitting layer 42 and the like is used.

As a material to form the hole transport layer 41, there can be mentioned electroconductive polymer materials such as polyaniline derivatives, polythiophene derivatives, polyvinyl carbazole derivatives, a mixture of poly(3,4-ethylenedioxythiophene) and polystyrene sulfonic acid (PEDOT:PSS), and the like. These hole-transporting materials can be dissolved or dispersed in a single or mixed solvent of toluene, xylene, acetone, methyl ethyl ketone, methyl isobutyl ketone, cyclohexanone, methanol, ethanol, isopropyl alcohol, ethyl acetate, butyl acetate, water and the like, to be coated by such a coating method as spin coating, bar coating, wire coating or slit coating. Patterning may be performed according to need. Further, to the hole transport layer 41, a surfactant, oxidation inhibitor, viscosity modifier, ultraviolet absorber and/or the like may be added according to need. The thickness of the hole transport layer 41 is preferably in the range from 10 nm to 200 nm. Or, low molecular weight materials such as TPD (triphenyl diamine) and α-NPD(bis[N-naphthyl-N-phenyl] benzidine) may be employed.

When employing an inorganic material as a hole-transporting material, an inorganic material such as $Cu_2O$, $Cr_2O_3$, $Mn_2O_3$, FeOx (x: around 0.1), NiO, CoO, $Pr_2O_3$, $Ag_2O$, $MoO_2$, $Bi_2O_3$, ZnO, $TiO_2$, $SnO_2$, $ThO_2$, $V_2O_5$, $Nb_2O_5$, $Ta_2O_5$, $MoO_3$, $WO_3$ and $MnO_2$ may be formed into a film using a vacuum evaporation method or a sputtering method. A mask may be used according to need. Further, patterning may be performed after film formation according to need.

Next, on the hole transport layer 41, the light-emitting layer 42 is built (laminated). The light-emitting layer 42 may have not only a monolayer structure, but also a multilayer structure in which a charge transport layer and the like are additionally provided. As the light-emitting layer 42, for example, there may be employed an organic light-emitting material that is soluble in an organic solvent, such as coumarin-based, perylene-based, pyran-based, anthrone-based, porphyrin-based, quinacridone-based, N,N'-dialkyl-substituted quinacridone-based, naphthalimide-based and N,N'-diaryl-substituted pyrrolopyrrole-based materials, and iridium complexes; a dispersion formed by dispersing the organic light-emitting material in a polymer such as polystyrene, polymethyl methacrylate and polyvinyl carbazole; and polymer fluorescent materials such as polyarylene-based, polyarylene vinylene-based and polyfluorene-based materials. These polymer fluorescent materials can be dissolved in a single or mixed solvent of toluene, xylene, acetone, methyl ethyl ketone, methyl isobutyl ketone, cyclohexanone, methanol, ethanol, isopropyl alcohol, ethyl acetate, butyl acetate, water and the like, to be coated by such a coating method as a spin coating method, curtain coating method, bar coating method, wire coating method and slit coating method. In addition, a printing method can also be employed (described later). To a polymer fluorescent material layer, a surfactant, oxidation inhibitor, viscosity modifier, ultraviolet absorber and/or the like may be added, according to need. In each case of a mono- or multi-layer structure, the total thickness of the light-emitting layer 42 is preferably 1000 nm or less, more preferably in the range of from 50 nm to 150 nm. Alternatively, low molecular weight fluorescent materials prepared by doping quinacridone, a coumarin derivative, rubrene, a DCM(4-(Dicyanomethylene)-2-methyl-6-(p-dimethylaminostyryl)-4 H-pyran) derivative, perylene, an iridium complex and/or the like to an aluminum-quinoline complex, distyryl derivative or the like can be employed.

For low molecular weight fluorescent materials, color to be emitted is determined by the material itself and/or a dopant. There are employed materials prepared by doping a styrylarylene derivative or styrylamine derivative to a distylarylene derivative for blue emitting light; an aluminum-quinoline complex and the like for green emitting light; a material prepared by doping DCM to an aluminum-quinoline complex, and the like for red emitting light; and a multilayer structure of a blue light-emitting material and a yellow to orange light-emitting material, and the like for white emitting light. On the other hand, for polymer fluorescent materials, the color to be emitted can be adjusted by the replacement of a side chain, and a polymer having the same basic skeleton can be used for R, G and B emitting light. By mixing these, white emitting light can be obtained.

When an organic EL layer is formed by an R, G and B selective coating system, it is performed through masked vacuum evaporation in the case of a low molecular light-emitting layer, but performing uniform selective coating for a large area is difficult. In the case of a high molecular light-emitting layer, a printing method can be used, to enable uniform selective coating for a large area to be performed. As the printing method, an ink jet, reverse printing and flexographic printing methods, and the like can be employed. In particular, a flexographic printing method can perform uniform printing for a large area in a short period of time, and is most preferable (described later). Incidentally, for masked vacuum evaporation, and also for printing methods such as ink jet, reverse printing and flexographic printing, room temperature is usable as substrate temperature.

As the common electrode 5, one corresponding to light-emitting properties of an organic EL layer can be used, including, for example, single metal of lithium, magnesium, calcium, ytterbium or aluminum, or an alloy thereof, or an alloy of these and a stable metal such as gold or silver. These materials can be provided by a vacuum evaporation method using common resistance heating, EB heating or the like. The thickness thereof is not particularly limited, but it is preferably in the range from 1 nm to 500 nm. A thin film of lithium fluoride or the like may be arranged between a cathode layer and a light-emitting layer. Further, on the cathode layer, a protective layer formed of an insulating inorganic material or resin may be provided. In these processes also, room temperature suffices as substrate temperature.

Figure 11:
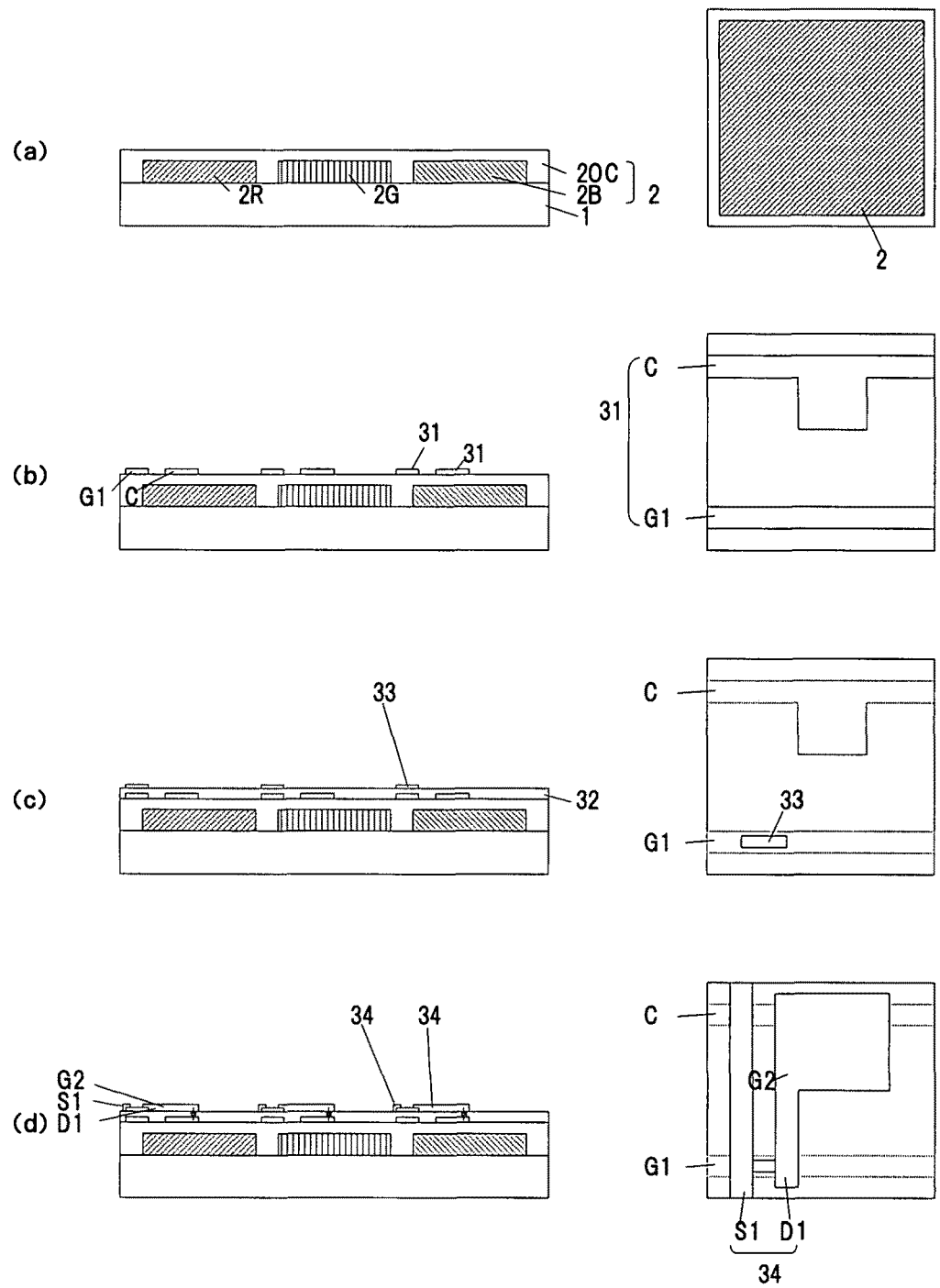
FIGS. 11(a)-(d) are cross-sectional and top views showing an example of the method for producing a color EL display of the invention.
Figure 12:
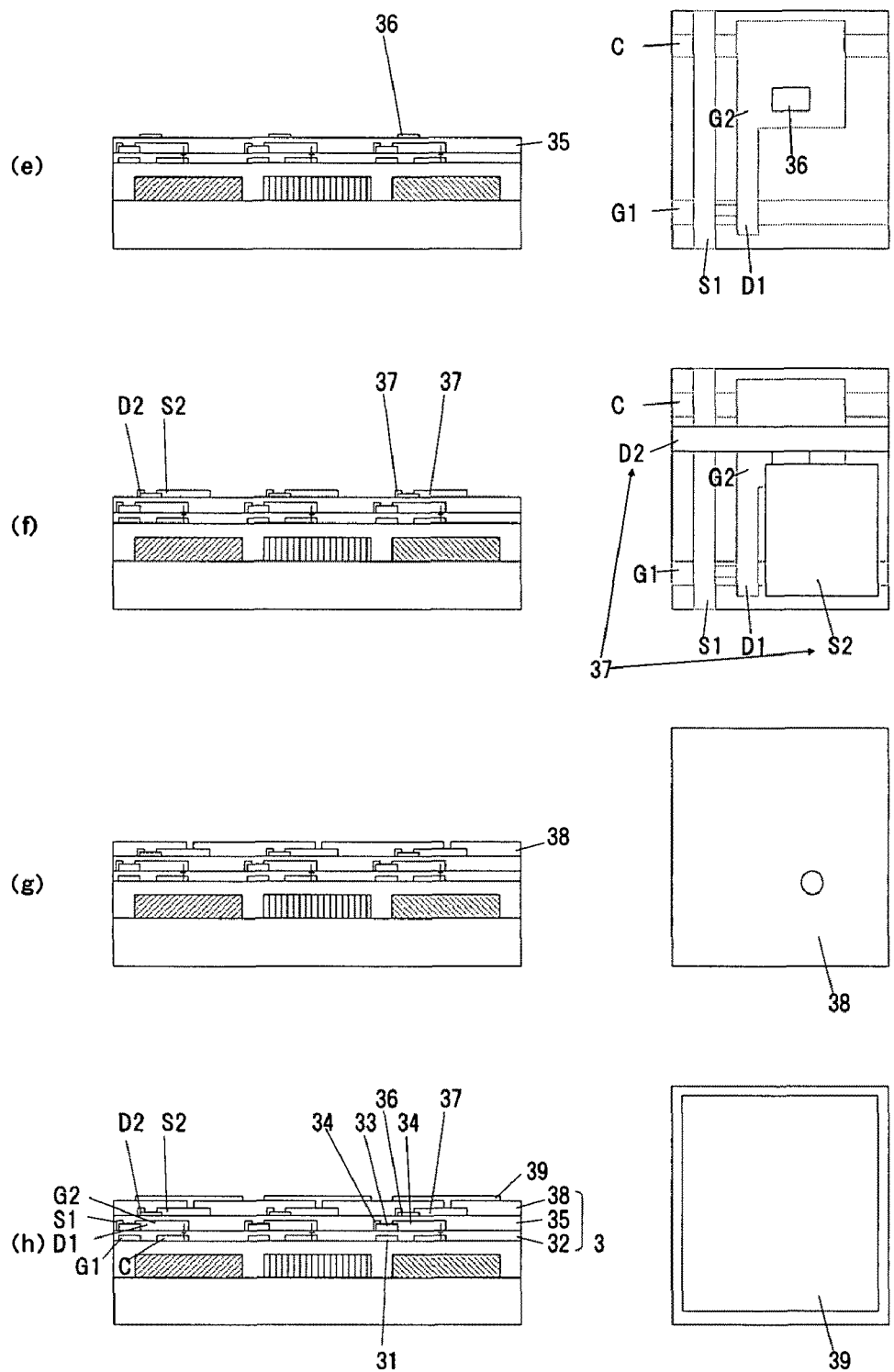
FIGS. 12(e)-(h) are cross-sectional and top views showing an example of the method for producing a color EL display of the invention.
Figure 13:
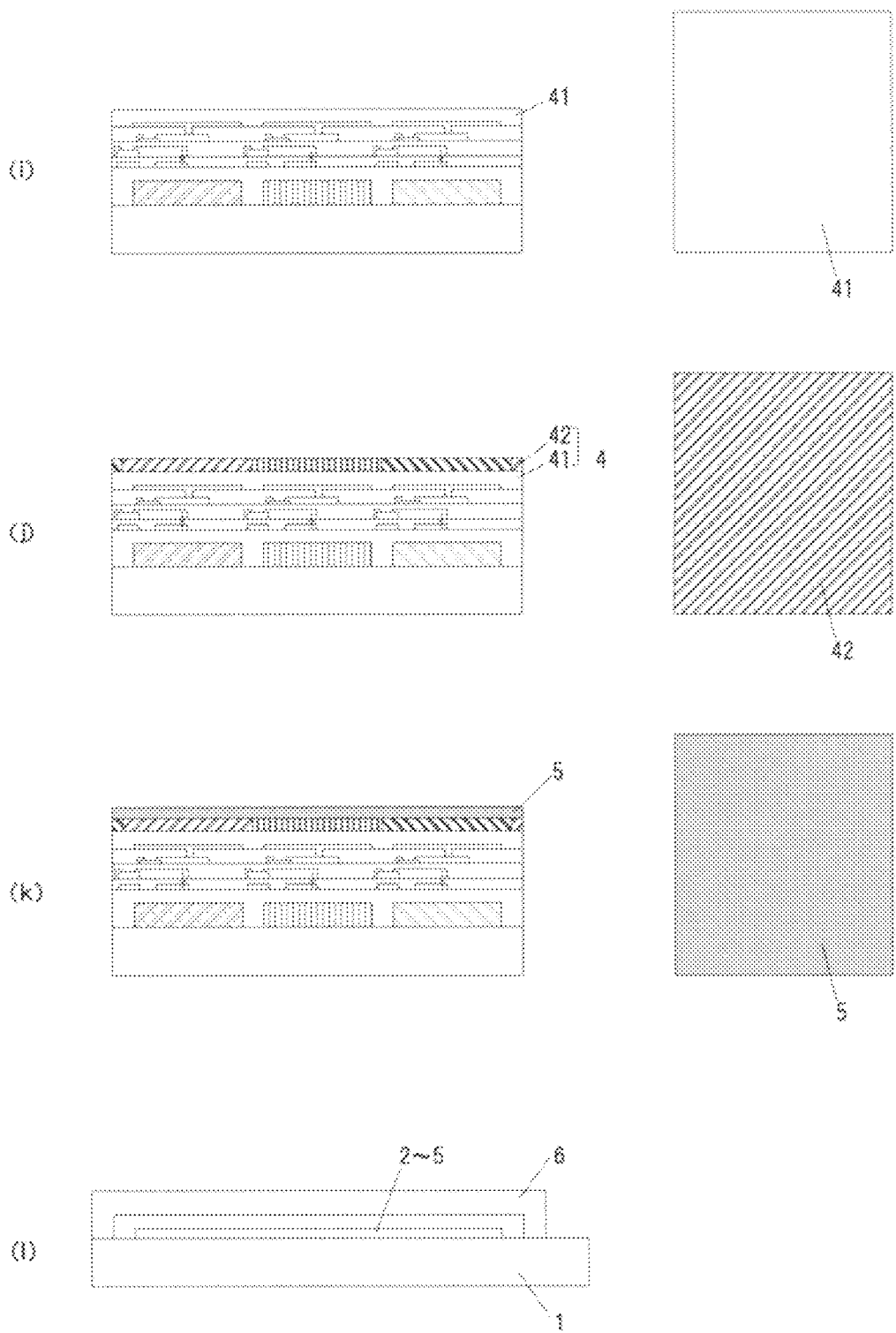
FIGS. 13(i)-(l) are cross-sectional and top views showing an example of the method for producing a color EL display of the invention.

Next, a method for producing a color EL display of the invention is described in detail. FIGS. 11 to 13 show an example of a method for producing a color EL display having the TFT circuit shown in FIG. 7. On the transparent substrate 1, the color filter 2 is formed through pigment-dispersed resist coating, exposure, development and burning (FIG. 11A). 2R denotes red, 2G denotes green, 2B denotes blue, and 2OC denotes over coating. Here, for the over coating, neither exposure nor development is necessary. Burning temperature is slightly higher than 200° C.

Next, as a first electrode layer 31 including a gate electrode G1 and capacitor electrode C, ITO is formed into a film by reactive sputtering or the like, which is patterned through photoresist coating, exposure, development, etching, resist strip and the like (FIG. 11B). Then, a first insulating layer 32 and a first semiconductor layer 33 are formed by reactive sputtering or the like, and the first semiconductor 33 is patterned through photoresist coating, exposure, development, etching, resist strip and the like (FIG. 11C). Further, ITO is formed into a film as a second electrode layer 34 including source electrode S1, drain electrode D1 and concurrently gate electrode G2 by reactive sputtering or the like, which is patterned using a photolithographic technology (FIG. 11D). Then, a second insulating layer 35 and a second semiconductor layer 36 are formed by reactive sputtering or the like, and the second semiconductor layer 36 is patterned (FIG. 12E). Further, ITO is formed into a film and patterned as a third electrode layer 37 including source electrode S2 and drain electrode D2 (FIG. 12F). Then, a third insulating layer 38, which covers the second semiconductor layer 36 and drain electrode D2, is formed and patterned (FIG. 12G). Further, a fourth electrode layer 39 is formed and patterned (FIG. 12H). On this occasion, the fourth electrode layer 39 operates as a pixel electrode.

Then, the organic EL layer 4 is formed. Firstly, a hole transport layer 41 is coated on the whole surface (FIG. 13I). Next, a red light-emitting layer 42R, green light-emitting layer 42G and blue light-emitting layer 42B are sequentially formed by flexographic printing (FIG. 13J).

Further, a common electrode 5 is formed on the whole surface by vacuum evaporation (FIG. 13K). Finally, it is desirably sealed by such a method as covering the whole with the seal glass 6, or forming a sealing layer (FIG. 13L: only this drawing shows a cross-sectional view of the sample as a whole). The seal glass 6 can be sealed with an adhesive agent such as epoxy resin, and, in a vacant space between the sample and the seal glass 6, a drying agent may be placed.

The aforementioned process of forming a TFT circuit and all the subsequent processes (FIGS. 11B to 13L) are performed at 200° C. or less.

Figure 14:
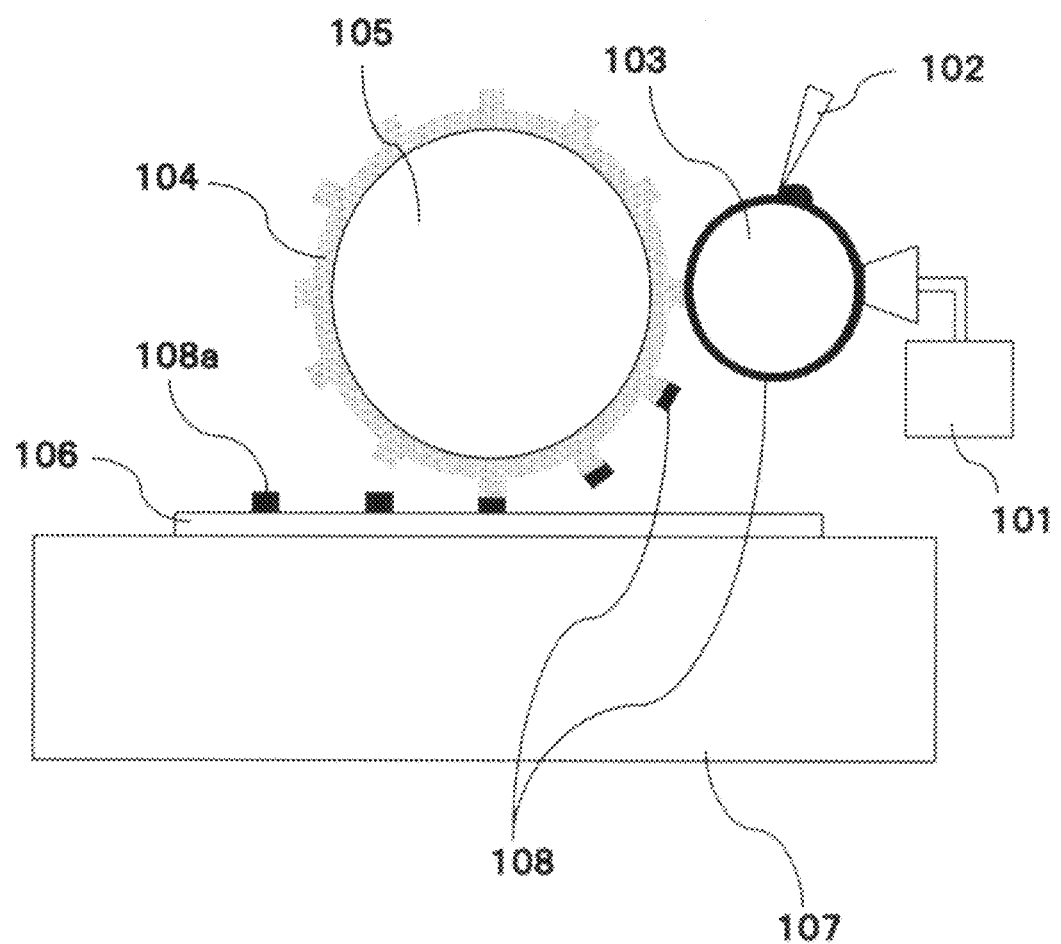
FIG. 14 is a schematic view showing an example of a printing machine for use in the production method of a color EL display of the invention.

Here, flexographic printing is described in detail. FIG. 14 shows an example of a printing machine using a flexo plate. From an ink replenishing apparatus 101 to an inking apparatus 103 for a flexo plate, an ink 108 containing an organic light-emitting material is replenished. An excess amount of the ink 108 containing an organic light-emitting material replenished to the inking apparatus 103 can be removed with a doctor apparatus 102. For an ink replenishing apparatus, a dropping type, fountain roll, coaters such as slit coater, die coater and cap coater, or the combination thereof can also be employed. For the doctor apparatus 102, in place of a doctor blade, a doctor roll can also be employed.

After an excess ink has been removed with the doctor apparatus 102, inking is performed to a cylinder 105, at least the surface of which is constituted as a flexo plate 104 for producing an organic EL element. The inking to the flexo plate 104 for producing an organic EL element is sufficient if it is performed at least to an image-forming portion of the plate. An ink that has been inked to the flexo plate 104 for producing an organic EL element is printed to a body to be transferred 106. The body to be transferred 106 is a sample having the color filters 2 and TFT circuit 3 formed on a transparent substrate 1. An ink 108a containing an organic light-emitting material that has been printed on the body to be transferred 106 forms the light-emitting layer 42 of an organic EL element by drying.

As described above, an ink containing an organic light-emitting material is supplied to convex portions of the flexo plate 104, and then printed on the aforementioned substrate to be transferred 106. Examples of the solvent used for inks, which dissolves or disperses a light-emitting material, include a single or mixed solvent of toluene, xylene, acetone, methyl ethyl ketone, methyl isobutyl ketone, cyclohexanone, methanol, ethanol, isopropyl alcohol, ethyl acetate, butyl acetate, chloroform, methylene chloride, dichloroethane, trichloroethane, tetrachloroethylene, water and the like. In particular, aromatic solvents and halogen-containing solvents excel in dissolving an organic light-emitting material. To an ink containing an organic light-emitting material, a surfactant, oxidation inhibitor, viscosity modifier, ultraviolet absorber and/or drying agent may be added, according to need.

Figure 15:
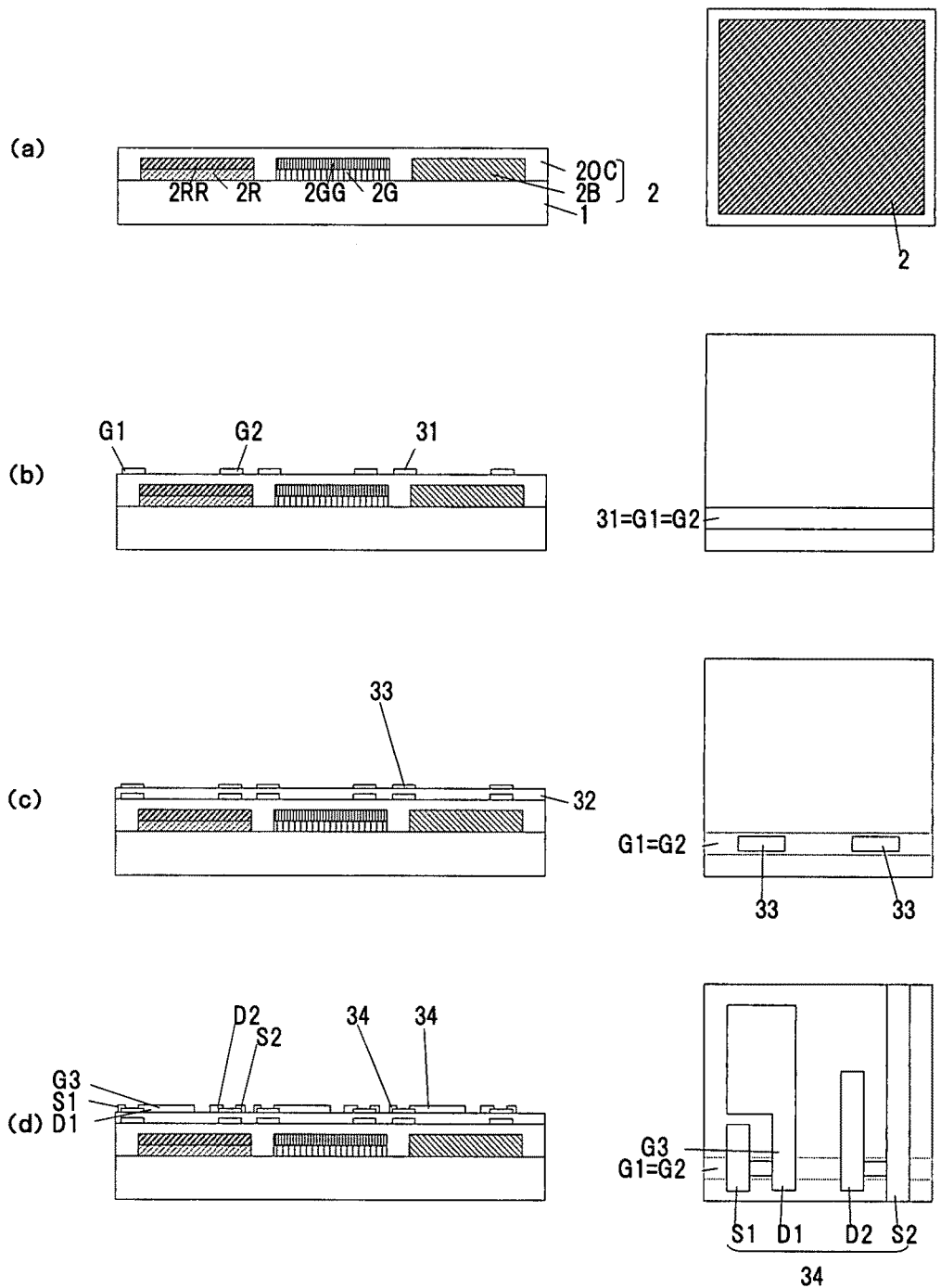
FIGS. 15(a)-(d) are cross-sectional and top views showing another example of the method for producing a color EL display of the invention.
Figure 16:
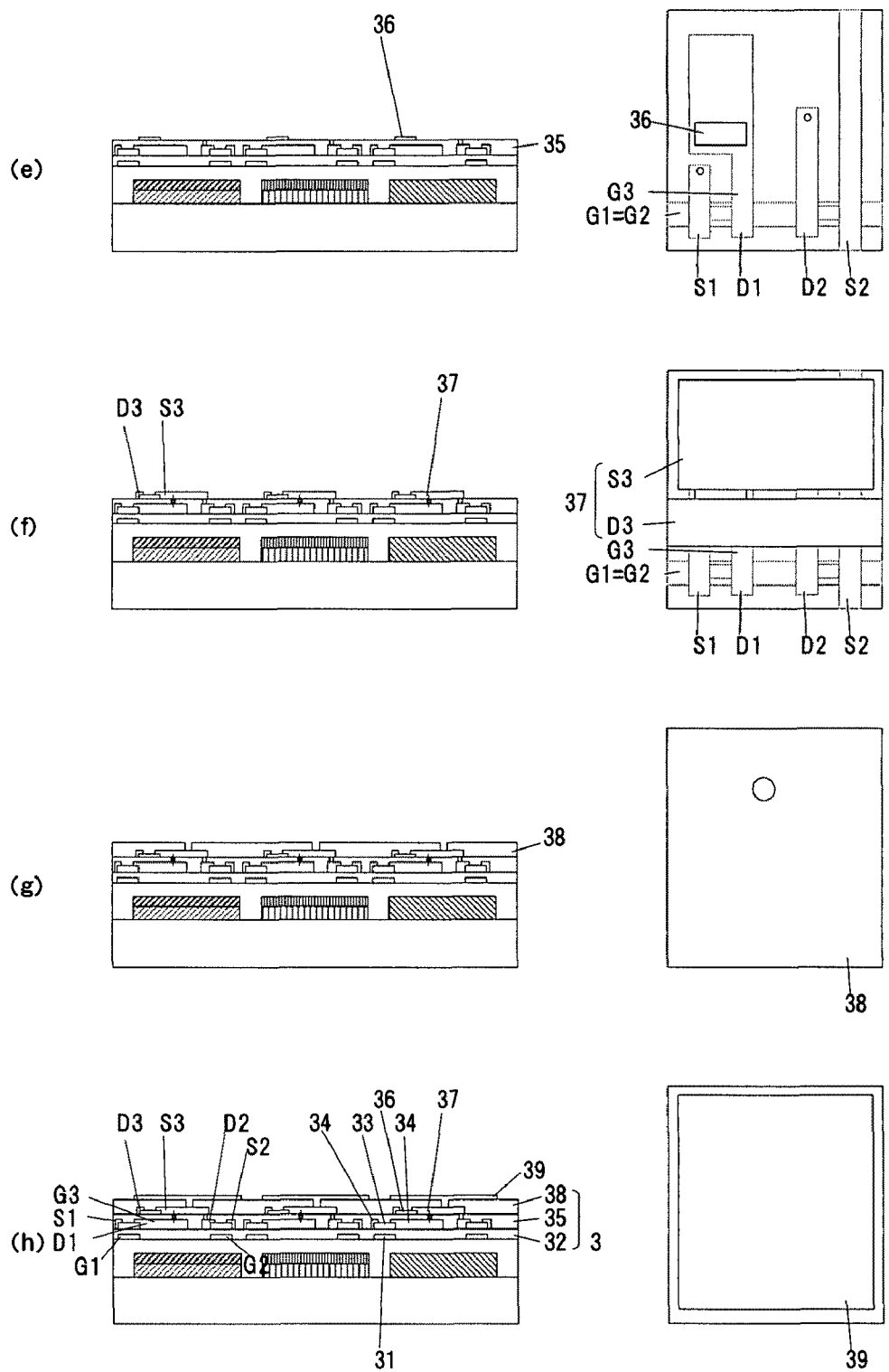
FIGS. 16(e)-(h) are cross-sectional and top views showing another example of the method for producing a color EL display of the invention.
Figure 17:
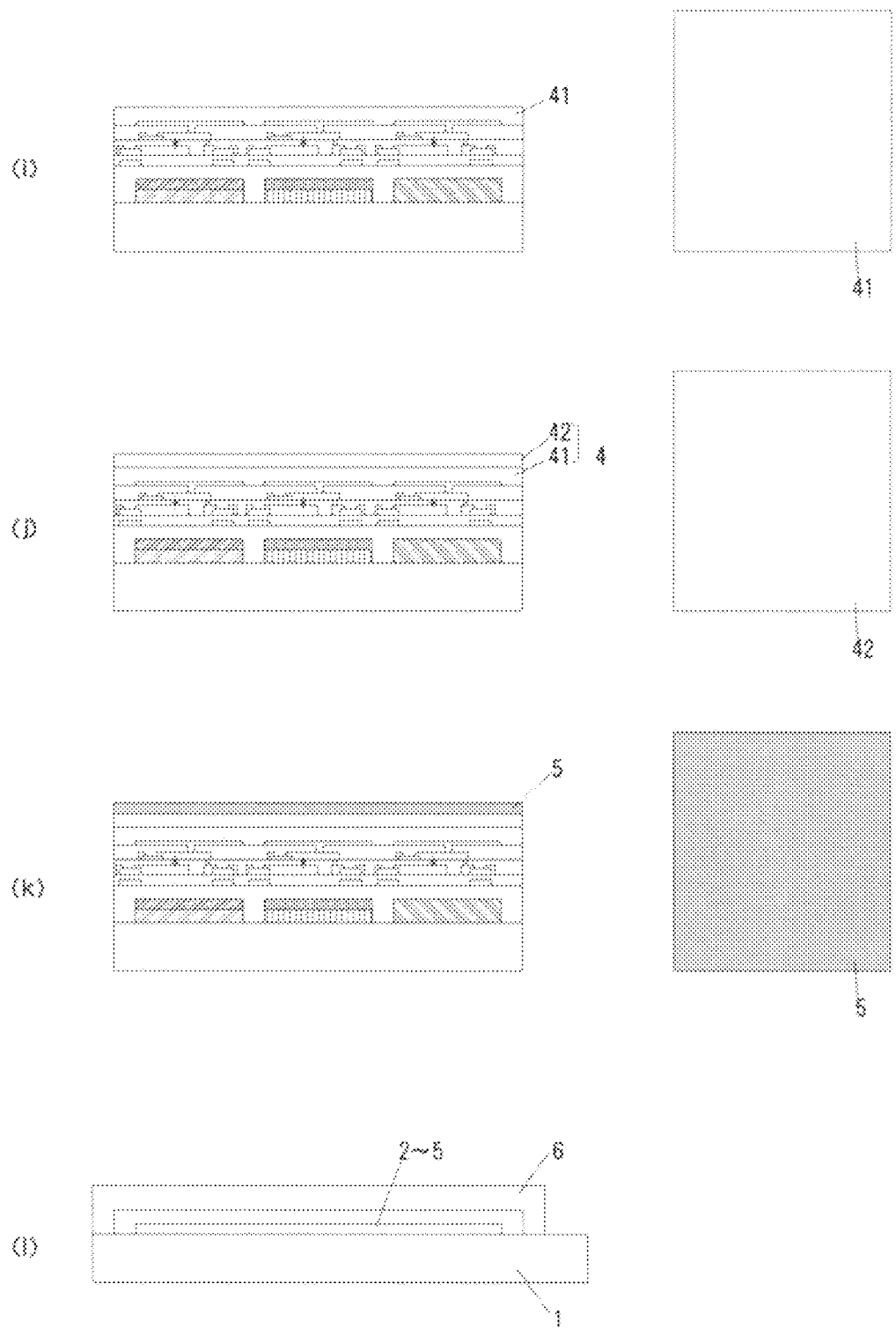
FIGS. 17(i)-(l) are cross-sectional and top views showing another example of the method for producing a color EL display of the invention.

Next, another example of the method for producing a color EL display of the invention is described in detail. FIGS. 15 to 17 show an example of a production method of a color EL display having the TFT circuit shown in FIG. 9. On the transparent substrate 1, the color filter 2 is formed through pigment-dispersed resist coating, exposure, development and burning, and then fluorescent coloring material-containing resist coating, exposure, development and burning (FIG. 15A) 2R is a red, 2G is a green and 2B is a blue band-limiting filters, respectively, 2RR is a red and 2GG is a green color conversion filters, and 2OC is an over coating. Here, for the over coating, neither exposure nor development is necessary.

Next, ITO is formed into a film as the first electrode layer 31 containing the gate electrodes G1 and G2 by reactive sputtering or the like, which is patterned through photoresist coating, exposure, development, etching, resist strip, and the like (FIG. 15B). Then, the first insulating layer 32 and first semiconductor layer 33 are formed by reactive sputtering or the like. Subsequently, the first semiconductor layer 33 is patterned through photoresist coating, exposure, development, etching, resist strip and the like (FIG. 15C). Further, ITO is formed into a film as the second electrode layer 34 including the source electrode S1, drain electrode D1 and concurrently gate electrode G3, source electrode S2 and drain electrode D2 by reactive sputtering or the like, which is patterned using a photolithographic technology (FIG. 15D). Then, the second insulating layer 35 and second semiconductor layer 36 are formed by reactive sputtering or the like, and the second semiconductor layer 36 and second insulating layer 35 are patterned (FIG. 16E). Further, ITO is formed into a film and patterned as the third electrode layer 37 including the source electrode S3 and drain electrode D3 (FIG. 16F). Here, a capacitor is formed between G3 and S3. S1 and D3, and D2 and S3 are connected with each other at each opening of the second insulating layer 35. Then, the third insulating layer 38, which covers the second semiconductor layer 36 and drain electrode D3, is formed and patterned (FIG. 16G). Furthermore, the fourth electrode layer 39 is formed and patterned (FIG. 16H). On this occasion, the fourth electrode layer 39 operates as a pixel electrode.

Then, the organic EL layer 4 is formed. Firstly, the hole transport layer 41 is formed on the whole surface (FIG. 17I). Next, a white light-emitting layer 42W is formed on the whole surface (FIG. 17J).

As a method for forming a light-emitting layer on the whole surface, a vacuum evaporation method, coating method and the like are mentioned, and, in order to form effectively a large area, a coating method can suitably used. As a coating method, a publicly known method such as a die coat method, gravure method, spin coating method, flexographic printing method, and offset printing method can suitably employed.

Furthermore, the common electrode 5 is formed on the whole surface by vacuum evaporation (FIG. 17K). Finally, it is desirably sealed by such a method as covering the whole with the seal glass 6, or forming a sealing layer (FIG. 17L: only this drawing shows a cross-sectional view of the sample as a whole). The seal glass 6 can be sealed with an adhesive agent such as epoxy resin, and, in a vacant space between the sample and the seal glass 6, a drying agent may be placed.

The aforementioned process of forming a TFT circuit and all the subsequent processes (FIGS. 15B to 17L) are performed at 200° C. or less.

According to the invention, since TFT is formed on color filters, the TFT and an organic EL layer can easily be connected, and it is possible to result in a simple and highly reliable structure. Further, by using an oxide semiconductor as a semiconductor of TFT, and using a transparent electro-conductive film as an electrode, it is possible to make a TFT circuit be transparent and/or have a multi-built structure, and to improve the aperture ratio.

Furthermore, according to the production method of the invention, color EL displays can be produced easily with high accuracy.

EXAMPLE

Hereinafter, specific embodiments of the present invention are described in detail while using Examples.

Example 1

As a transparent substrate 1, glass was used, on which color filters 2 were formed through pigment-dispersed resist coating, exposure, development and burning (FIG. 11A). 2R denotes red, 2G denotes green, 2B denotes blue, and 2OC denotes over coating. Here, for the over coating, neither exposure nor development is necessary. The burning temperature was 220° C.

Next, ITO was formed into a film as the first electrode layer 31 including the gate electrode G1 and capacitor electrode C, by reactive sputtering (room temperature, DC sputtering) under an $Ar+O_2$ gas using ITO as a target, which was patterned through photoresist coating, exposure, development, wet etching with hydrochloric acid, and resist strip (FIG. 11B). Then, each of SiON as the first insulating layer 32 and InGaZn oxide as the first semiconductor layer 33 was formed into a film continuously, by reactive sputtering (room temperature, RF sputtering) under an $Ar+O_2+N_2$ gas using SiN as a target, and by reactive sputtering (room temperature, RF sputtering) under an $Ar+O_2$ gas using $InGaZnO_4$ as a target, respectively. Subsequently, the first semiconductor layer 33 was patterned through photoresist coating, exposure, development, wet etching with hydrochloric acid and resist strip (FIG. 11C). Further, after previously forming photoresist patterns, ITO was formed into a film as the second electrode layer 34 including the source electrode S1, drain electrode D1 and concurrently gate electrode G2 by reactive sputtering similar to that for the first electrode layer 31, which was then patterned by a liftoff method (FIG. 11D). Subsequently, each of SiON as the second insulating layer 35, and InGaZn oxide as the second semiconductor layer 36 was formed into a film continuously by reactive sputtering. Then, the second semiconductor layer 36 was patterned through photoresist coating, exposure, development, wet etching with hydrochloric acid, and resist strip (FIG. 12E). On this occasion, the flow rate of $O_2$ in forming the second semiconductor layer 36 was controlled to be smaller than that in forming the first semiconductor layer 33. Further, after forming previously photoresist patterns, ITO was formed into a film as the third electrode layer 37 including the source electrode S2 and drain electrode D2 by reactive sputtering, which was patterned by a liftoff method (FIG. 12F). Then, after forming previously photoresist patterns on the source electrode S2 of the third electrode layer 37 as the third insulating layer 38, SiON was formed into a film by reactive sputtering, which was patterned in a figure having an opening above the source electrode S2 by a liftoff method, and further a photosensitive acrylic resin was coated, exposed and developed to form a two-layer insulating film (FIG. 12G). Furthermore, ITO was formed into a film as the fourth electrode layer 39, which was patterned through photoresist coating, exposure, development, wet etching with hydrochloric acid and resist strip (FIG. 12H). On this occasion, the fourth electrode layer operates as a pixel electrode.

Then, the organic EL layer 4 was formed. Firstly, a PEDOT:PSS solution was spin-coated on the whole surface as the hole transport layer 41, which was burned at 100° C. (FIG. 13I). Next, each of polyfluorene-based materials was coated sequentially by flexographic relief printing as a red light-emitting layer 42R, green light-emitting layer 42G and blue light-emitting layer 42B (FIG. 13J).

Further each of calcium 10 nm and silver 300 nm was formed into a film on the whole surface as a common electrode 5 by vacuum evaporation (FIG. 13K). Finally, the whole was covered with the seal glass 6 (FIG. 13L).

The aforementioned process of forming the TFT circuit and all the subsequent processes (FIGS. 11B to 13L) were performed at 200° C. or less. The color EL display thus produced could perform display having good color purity and brightness due to a large aperture ratio, when being viewed from the transparent substrate 1 side.

Example 2

As the transparent substrate 1, glass was used, on which color filters 2 were formed through pigment-dispersed resist coating, exposure, development, burning, fluorescent coloring material-containing resist coating, exposure, development and burning (FIG. 15A). 2R, 2G and 2B denote red, green and blue band-limiting filters, and 2RR and 2GG denote red and green color conversion filters, respectively, and 2OC is an over coating. Here, for the over coating, neither exposure nor development is necessary. The burning temperature was 200° C.

Next, ITO was formed into a film as a first electrode layer 31 including the gate electrodes G1 and G2 by reactive sputtering (room temperature, DC sputtering) under an Ar+$O_2$ gas using ITO as a target, which was patterned through photoresist coating, exposure, development, wet etching with hydrochloric acid, and resist strip (FIG. 15B). Then, each of SiON as the first insulating layer 32 and InGaZnMg oxide as the first semiconductor layer 33 was formed continuously into a film, by reactive sputtering (room temperature, RF sputtering) under an Ar+$O_2$+$N_2$ gas using SiN as a target and by reactive sputtering (room temperature, RF sputtering) under an Ar+$O_2$ gas using InGaZn$_{0.8}$Mg$_{0.2}$O$_4$ as a target, respectively. Then, the first semiconductor layer 33 was patterned through photoresist coating, exposure, development, wet etching with hydrochloric acid and resist strip (FIG. 15C). Further, after forming previously photoresist patterns, ITO was formed into a film as the second electrode layer 34 including the source electrode S1, drain electrode D1 and concurrently gate electrode G3, source electrode S2 and drain electrode D2, by the same reactive sputtering as that for the first electrode layer 31, which was patterned by a liftoff method (FIG. 15D). Then, each of SiON as the second insulating layer 35 and InGaZnMg oxide as the second semiconductor layer 36 was formed continuously into a film by reactive sputtering. Then, after patterning the second semiconductor layer 36 through photoresist coating, exposure, development, wet etching with hydrochloric acid and resist strip, the second insulating layer 35 was patterned through photoresist coating, exposure, development, fluorine-based dry etching and resist strip (FIG. 16E). Further, after forming previously photoresist patterns, ITO was formed into a film as the third electrode layer 37 including the source electrode S3 and drain electrode D3 by reactive sputtering, which was patterned by a liftoff method (FIG. 16F). Here, a capacitor is formed between G3 and S3. S1 and D3, and D2 and S3 are connected with each other at each opening of the second insulating layer 35. Then, after forming previously photoresist patterns on the source electrode S3 of the third electrode layer 37 as the third insulating layer 38, SiON was formed into a film by reactive sputtering, which was patterned into a figure having an opening in the source electrode S3 by a liftoff method, and further photosensitive acrylic resin was coated, exposed and developed to form a two-layer insulating film (FIG. 16G). Further, ITO was formed into a film as the fourth electrode layer 39, which was patterned through photoresist coating, exposure, development, wet etching with hydrochloric acid and resist strip (FIG. 16H). On this occasion, the fourth electrode layer operates as a pixel electrode.

Then, the organic EL layer 4 was formed. Firstly, a PEDOT:PSS aqueous solution was spin-coated on the whole surface to form the hole transport layer 41, which was burned at 110° C. (FIG. 17I). Next, a toluene solution of a mixture of polyolefin-based materials was spin-coated as a white light-emitting layer 42W, which was burned at 100° C. (FIG. 17J).

Further each of calcium 10 nm and silver 300 nm was formed into a film on the whole surface as a common electrode 5 by vacuum evaporation (FIG. 17K). Finally, the whole was covered with the seal glass 6 (FIG. 17L).

The aforementioned process of forming the TFT circuit and all the subsequent processes (FIGS. 15B to 17L) were performed at 200° C. or less. The color EL display thus produced could perform display having good color purity and brightness due to a large aperture ratio, when being viewed from the transparent substrate 1 side.

Example 3

A color EL display was produced in the same process as in Example 2, except that, as the light-emitting layer 42, a polyolefin-based material was used as a blue light-emitting layer 42B in place of a white light-emitting layer 42W. The process of forming a TFT circuit and all the subsequent processes were performed at 200° C. or less. The color EL display thus produced could perform display having good color purity and brightness due to a large aperture ratio, when being viewed from the transparent substrate 1 side.

Example 4

A color EL display was produced in the same process as in Example 2, except that a band-limiting type alone was used as the color filters 2. The process of forming a TFT circuit and all the subsequent processes were performed at 200° C. or less. The color EL display thus produced could perform display having good color purity and brightness due to a large aperture ratio, when being viewed from the transparent substrate 1 side.

What is claimed is:
1. A color EL display, comprising:
a transparent substrate;
color filters formed on the transparent substrate;
an over coating layer formed on and covering a whole of the color filters to be planarized,
a thin film transistor circuit directly formed on the over coating layer;
an organic EL layer formed on the thin film transistor circuit;
and
a common electrode formed on the organic EL layer,
wherein the thin film transistor circuit is substantially transparent and comprises a plurality of thin film transistors, wherein each of the plurality of the thin film transistors comprises a gate electrode, a source electrode, a drain electrodes a semiconductor layer and a pixel electrode, wherein the semiconductor layer is formed of an oxide semiconductor containing at least any one of an oxide of In, Ga, Zn, Sn and Mg, and wherein the organic EL layer comprises a hole transport layer directly formed on a whole surface of the pixel electrodes of said plurality of thin film transistors and a white light-emitting layer formed on the hole transport layer, and wherein the thin film transistor circuit comprises two or more semiconductor layers and one insulating layer, wherein the one insulating layer is between the two or more semiconductor layers, and wherein one of the two or more semiconductor layers is formed above the one insulating layer and the other of the two or more semiconductor layers is formed below the one insulating layer.

2. The color EL display according to claim 1, wherein said plurality of thin film transistors comprise at least a scanning thin film transistor and a driving thin film transistor, wherein a semiconductor layer of the scanning thin film transistor and a semiconductor layer of the driving thin film transistor respectively belong to different layers formed so as to overlap with each other above and below.

3. The color EL display according to claim 1, wherein the thin film transistor circuit further comprises a plurality of insulating layers, a plurality of electrode layers and a plurality of semiconductor layers, and wherein said a plurality of insulating layers, said a plurality of electrode layers or said a plurality of semiconductor layers are directly formed on the over coating layer of the color filters.

\* \* \* \* \*